United States Patent
Nakakawaji et al.

(10) Patent No.: US 8,313,844 B2
(45) Date of Patent: Nov. 20, 2012

(54) PHOSPHOR, METHOD FOR PRODUCTION THEREOF, WAVELENGTH CONVERTER, LIGHT EMITTING DEVICE AND LUMINAIRE

(75) Inventors: Fujito Nakakawaji, Kagoshima (JP); Toshiaki Shigeoka, Kagoshima (JP); Shuichi Kasai, Kagoshima (JP)

(73) Assignee: Kyocera Corporation, Kyoto (JP)

( * ) Notice: Subject to any disclaimer, the term of this patent is extended or adjusted under 35 U.S.C. 154(b) by 521 days.

(21) Appl. No.: 12/528,068

(22) PCT Filed: Jan. 31, 2008

(86) PCT No.: PCT/JP2008/051588
§ 371 (c)(1),
(2), (4) Date: Aug. 20, 2009

(87) PCT Pub. No.: WO2008/102628
PCT Pub. Date: Aug. 28, 2008

(65) Prior Publication Data
US 2010/0033074 A1 Feb. 11, 2010

(30) Foreign Application Priority Data

Feb. 23, 2007 (JP) ................................. 2007-043819
Jul. 25, 2007 (JP) ................................. 2007-193016
Jul. 27, 2007 (JP) ................................. 2007-196078

(51) Int. Cl.
*H01J 1/62* (2006.01)
*C09K 11/08* (2006.01)

(52) U.S. Cl. .......... 428/690; 252/301.4 F; 252/301.4 H; 252/301.4 R; 313/483

(58) Field of Classification Search ............ 252/301.4 F, 252/301.4 H, 301.4 R
See application file for complete search history.

(56) References Cited

U.S. PATENT DOCUMENTS

| | | | |
|---|---|---|---|
| 7,201,858 B2 * | 4/2007 | Shida et al. | ............. 252/301.4 F |
| 2002/0163302 A1 | 11/2002 | Nitta et al. | |
| 2004/0212302 A1 * | 10/2004 | Letz et al. | ..................... 313/512 |
| 2006/0231796 A1 | 10/2006 | Shida et al. | |
| 2007/0085107 A1 | 4/2007 | Nitta et al. | |

FOREIGN PATENT DOCUMENTS

| | | |
|---|---|---|
| JP | 2002-314142 | 10/2002 |
| JP | 2004-115633 | 4/2004 |
| JP | 2006-111830 | 4/2006 |

* cited by examiner

*Primary Examiner* — Camie Thompson
(74) *Attorney, Agent, or Firm* — Birch, Stewart, Kolasch & Birch, LLP

(57) ABSTRACT

A phosphor operable to absorb ultraviolet or visible light and emit visible light with longer wavelength and a process for producing same is disclosed. A wavelength converter phosphor material comprising Eu, Mg, Mn, and Si as essential components converts the wavelength of light emitted from a light-emitting element such as a light emitting diode (LED) into a changed wavelength for emission. An illumination device such as a luminaire may be equipped with the wavelength converter.

11 Claims, 7 Drawing Sheets

BEFORE REDUCTION

PHOSPHOR, METHOD FOR PRODUCTION THEREOF, WAVELENGTH CONVERTER, LIGHT EMITTING DEVICE AND LUMINAIRE

CROSS-REFERENCE TO RELATED APPLICATION

The present application is the United States national stage application of international application serial number PCT/JP2008/051588, filed on Jan. 31, 2008, which claims priority to Japanese patent application no. 2007-043819, filed on Feb. 23, 2007, Japanese patent application no. 2007-193016 filed on Jul. 25, 2007, and Japanese patent application no. 2007-196078, filed on Jul. 27, 2007, each of which is incorporated herein by reference in its entirety.

TECHNICAL FIELD OF THE INVENTION

The present invention relates generally to wavelength conversion and more particularly to wavelength conversion materials and devices.

BACKGROUND

Light-emitting elements including semiconductor materials (hereinafter also referred to as LED chips) are small and capable of emitting bright colors with high power efficiency. LED chips are characterized by having long product life and low power consumption, and being robust to repeated on/off switching. As such, they are useful for lighting sources such as liquid crystal display backlights and lamps.

LED chips can be used for illumination devices which have a phosphor to change part of the light wavelengths from the LED chips and emit a mixture of light with the changed wavelength so that light of a color different from that of the LED can be emitted. Light with a non-changed wavelength from the LED can also be emitted.

Existing technology uses a violet LED chip having a peak at 400 nm or less as a light-emitting element. A structure containing a mixture of three types of phosphors in a polymer resin can be used in a wavelength converter. The wavelength converter can convert violet light to red, and can convert yellow to green and blue wavelengths, respectively so that white light can be emitted. Europium (Eu)-containing phosphors have been actively developed to provide phosphors capable of being used in combination with an LED chip as a light-emitting element having a peak wavelength at 400 nm or less and capable of emitting color of yellow to green (hereinafter referred to as "yellow to green color").

A phosphor represented by $Sr_{2-x-y}Ba_xEu_ySiO_4$ and the production of the phosphor with a (Sr+Ba+Eu)/Si molar ratio of 2, where the (Sr+Ba+Eu)/Si molar ratio is a sum of the molar ratios Sr/Si, Ba/Si and Eu/Si has been used to produce luminous efficiency of the illumination device. However, the luminous efficiency of the illumination device produced with this phosphor is still low, and therefore, an increase in luminous efficiency is needed.

Therefore, there is a need for a phosphor operable to efficiently absorb ultraviolet or visible light and emit visible light with longer wavelength.

SUMMARY

A fluorescent substance such as a phosphor operable to absorb ultraviolet or visible light and emit a visible light with a longer wavelength and a process for producing same is disclosed. A wavelength converter phosphor material comprising Eu, Si, and at least one of Sr, Ba and Ca as essential components converts a wavelength of light emitted from a light-emitting element such as a light emitting diode (LED) into a changed wavelength for emission. An illumination device such as a luminaire may be equipped with the wavelength converter.

A first embodiment comprises a phosphor. The phosphor comprises $M^1$, Eu and Si, where $M^1$ represents at least one of Sr, Ba and Ca and comprising a crystal represented by $(M^1, Eu)_2SiO_4$ as a main crystal. The phosphor comprises a divalent Eu ion concentration of 90% or more, based on total amount of divalent and trivalent Eu ions, and a $(M^1+Eu)/Si$ molar ratio of less than 2, wherein the $(M^1+Eu)/Si$ molar ratio is a sum of a molar ratio of $M^1$ to Si and a molar ratio of Eu to Si.

A second embodiment comprises a method for producing a phosphor. The process comprises heat-treating a raw material mixture in an oxidizing atmosphere to obtain a mixed powder comprising an Eu-containing apatite-type crystal powder and a powder of a matrix material represented by a formula $M^1_2SiO_4$. The raw material mixture comprises a mixture of a flux and phosphor raw materials that comprise an $M^1$ source material. $M^1$ represents at least one of Sr, Ba, Ca, a Eu source material, and a Si source material, and has a $(M^1+Eu)/Si$ molar ratio of less than 2. The $(M^1+Eu)/Si$ molar ratio is a sum of the molar ratio of $M^1$ to Si and the molar ratio of Eu to Si. The process further comprises heat-treating the mixed powder in a reducing atmosphere to produce phosphor particles.

A third embodiment comprises a wavelength converter. The wavelength converter comprises an optically transmissive matrix operable to receive a first light and emit a second light. A first wavelength of the first light is different from a second wavelength of the second light. The wavelength converter further comprises a phosphor dispersed in the optically transmissive matrix. The phosphor comprises $M^1$, Eu and Si. $M^1$ represents at least one of Sr, Ba and Ca and comprising a crystal represented by $(M^1,Eu)_2SiO_4$ as a main crystal. The phosphor comprises a divalent Eu ion concentration of 90% or more based on total amount of divalent and trivalent Eu ions, and a $(M^1+Eu)/Si$ molar ratio of less than 2, wherein the $(M^1+Eu)/Si$ molar ratio is a sum of a molar ratio of $M^1$ to Si and a molar ratio of Eu to Si.

A fourth embodiment comprises an illumination device. The illumination device comprises a base member, a light-emitting element coupled to the base member, and a wavelength converter operable to change a wavelength of light emitted from the light emitting element. The wavelength converter comprises an optically transmissive matrix operable to receive a first light and emit a second light. A first wavelength of the first light is different from a second wavelength of the second light. The wavelength converter further comprises a phosphor dispersed in the optically transmissive matrix. The phosphor comprises $M^1$, Eu and Si. $M^1$ represents at least one of Sr, Ba and Ca and comprising a crystal represented by $(M^1,Eu)_2SiO_4$ as a main crystal. The phosphor comprises a divalent Eu ion concentration of 90% or more based on total amount of divalent and trivalent Eu ions, and a $(M^1+Eu)/Si$ molar ratio of less than 2, wherein the $(M^1+Eu)/Si$ molar ratio is a sum of a molar ratio of $M^1$ to Si and a molar ratio of Eu to Si.

BRIEF DESCRIPTION OF THE DRAWINGS

Embodiments of the present disclosure are hereinafter described in conjunction with the following figures, wherein like numerals denote like elements. The figures are provided for illustration and depict exemplary embodiments of the invention. The figures are provided to facilitate understanding of the invention without limiting the breadth, scope, scale, or applicability of the invention. The drawings are not necessarily made to scale.

DETAILED DESCRIPTION OF EXEMPLARY EMBODIMENTS

As would be apparent to one of ordinary skill in the art after reading this description, these are merely examples and the embodiments of the invention are not limited to operating in accordance with these examples. Other embodiments may be utilized and structural changes may be made without departing from the scope of the exemplary embodiments of the present invention.

The luminous efficiency of an illumination device produced with the existing phosphor is low, and therefore, it is necessary to increase the luminous efficiency. Therefore, it is necessary to improve the quantum efficiency of the phosphor.

In one embodiment, a phosphor containing $M^1$, Eu and Si, where $M^1$ represents at least one of Sr, Ba and Ca is provided. The phosphor comprises a crystal represented by $(M^1,Eu)_2 SiO_4$ as a main crystal and has a divalent Eu ion concentration of 90% or more, as determined from an X-ray absorption near edge structure (XANES) spectrum, based on the total amount of divalent and trivalent Eu ions. The phosphor also has a $(M^1+Eu)/Si$ molar ratio of less than 2, where the $(M^1+Eu)/Si$ molar ratio is the sum of the molar ratio of $M^1$ to Si and the molar ratio of Eu to Si.

In this embodiment, the $(M^1+Eu)/Si$ molar ratio is preferably 1.78 or more, and the divalent Eu ion concentration is preferably 96% or more, based on the total amount of divalent and trivalent Eu ions.

The phosphor preferably comprises a plurality of phosphor particles. Each of the phosphor particles preferably comprises a phosphor core and a large number of fibrous bodies present on the surface of the phosphor core. At least one end of each of the fibrous bodies is preferably embedded in the phosphor core. Each of the fibrous bodies preferably comprises an embedded part embedded in the phosphor core and a non-embedded part not embedded in the phosphor core. The non-embedded part is preferably separated from the surface of the phosphor core.

In one embodiment, a method for producing a phosphor is provided. The phosphor is produced by heat-treating a raw material mixture in an oxidizing atmosphere to produce a mixed powder including a Eu-containing apatite-type crystal powder and a powder of a matrix material represented by the formula $M^1_2SiO_4$. The raw material mixture comprises a mixture of a flux and phosphor raw materials that comprises an $M^1$ source material. The $M^1$ source material represents at least one element, such as but without limitation, Sr, Ba and Ca, a Eu source material, and a Si source material and has a $(M^1+Eu)/Si$ molar ratio of less than 2. The $(M^1+Eu)/Si$ molar ratio is the sum of the molar ratio of $M^1$ to Si and the molar ratio of Eu to Si (oxidation treatment step). The method may continue by heat-treating the mixed powder in a reducing atmosphere to produce phosphor particles (reduction treatment step).

The heat-treatment in the reduction treatment step may be performed at a temperature of 1150° C. or less. After the reduction treatment step, the method may further comprise the step of washing the surface of the phosphor particles to form a phosphor core and fibrous bodies in such a manner that at least one end of each fibrous body is embedded in the phosphor core and that any other part of each fibrous body is exposed.

In one embodiment, a wavelength converter operable to change a wavelength of incident light and outputting light containing light with the changed wavelength is provided. The wavelength converter may comprise: a transparent matrix and a phosphor dispersed in the transparent matrix.

In one embodiment, an illumination device is provided. The illumination device may comprise: a base component comprising a mount comprising a surface capable of supporting a light-emitting element. An electrical wiring is provided on the surface of the base component or in the base component. The light-emitting element is placed on the mount and electrically coupled to the electrical wiring. The wavelength converter is operable to change the wavelength of light emitted from the light-emitting element.

In one embodiment a luminaire comprising a plurality of the illumination devices is provided.

Embodiments of the invention provide a phosphor capable of emitting yellow to green color with a quantum efficiency higher than that of the conventional phosphor with a $(Sr+Ba+Eu)/Si$ molar ratio of 2.

Embodiments of the invention improve white light luminous efficiency when the wavelength converter is used in an illumination device, improve the white light luminous efficiency of an illumination device, and improve the color rendering properties of a luminaire.

In one embodiment of the present invention, the phosphor contains $M^1$, Eu and Si. $M^1$ represents at least one element selected from, for example but without limitation, Sr, Ba and Ca. The phosphor comprises a crystal represented by $(M^1, Eu)_2 SiO_4$ as a main crystal and has a divalent Eu ion concentration of 90% or more, as determined from an X-ray absorption near edge structure (XANES) spectrum, based on the total amount of divalent and trivalent Eu ions.

The phosphor also has a $(M^1+Eu)/Si$ molar ratio of less than 2, where the $(M^1+Eu)/Si$ molar ratio is a sum of the molar ratio of $M^1$ to Si and the molar ratio of Eu to Si. The phosphor may comprise an aggregate of a plurality of phosphor particles.

As explained above, an existing phosphor represented by $Sr_{2-x-y}Ba_xEu_ySiO_4$ has a $(Sr+Ba+Eu)/Si$ molar ratio of 2, where the $(Sr+Ba+Eu)/Si$ molar ratio is the sum of the molar ratios Sr/Si, Ba/Si and Eu/Si (also simply referred to as "total molar ratio"). In contrast, according to an embodiment of the present invention, the total molar ratio $(Sr+Ba+Eu)/Si$ is less than 2, more preferably 1.94 or less, in the range where the divalent Eu ion concentration is 90% or more based on the total amount of divalent and trivalent Eu ions, namely in the range satisfying the relation $Eu^{2+}/(Eu^{2+}+Eu^{3+}) \geqq 0.9$. In this manner, the phosphor according to an embodiment of the present invention achieves higher luminous efficiency than that of the existing phosphor having a total molar ratio of (Sr+Ba+Eu)/Si of 2.

As used herein, the term "total molar ratio (Sr+Ba+Eu)/Si" does not refer to a value determined from the element composition of the $Sr_{2-x-y}Ba_xEu_ySiO_4$ crystal in the phosphor, but to a value determined from the element composition of the phosphor.

An ideal fluorescence-emitting $(M^1,Eu)_2SiO_4$ crystal such as a $Sr_{2-x-y}Ba_xEu_ySiO_4$ crystal ($0 \leqq x \leqq 1$, $0.01 \leqq y \leqq 0.1$) has a stoichiometric ratio such that the total molar ratio (Sr+Ba+Eu)/Si is equal to 2; therefore, the composition of the phosphor itself can preferably be set so that the total molar ratio (Sr+Ba+Eu)/Si will be equal to 2. Phosphors with high quantum efficiency are obtained when the total molar ratio (Sr+Ba+Eu)/Si is less than 2 ((Sr+Ba+Eu)/Si<2), specifically 1.94 or less, more specifically in the range of 1.78 to 1.94, which deviates from the stoichiometric ratio. In particular, the total molar ratio (Sr+Ba+Eu)/Si is preferably from 1.89 to 1.91.

The value of x may be any number in the range of 0 to 1. When x is equal to 0 or 1, a yellow or green phosphor can be obtained. In this range, therefore, any color in the range of yellow to green (hereinafter also referred to as "yellow to green color") can be emitted. When x is 1 or less ($x \leqq 1$), water resistance can be improved. $M^1$ preferably represents a combination of Sr and Ba.

In this embodiment, the phosphor has a divalent Eu ion concentration of 90% or more $(Eu^{2+}/(Eu^{2+}+Eu^{3+}) \geqq 0.9)$ based on the total amount of divalent and trivalent Eu ions (hereinafter, the divalent Eu ion concentration based on the total amount is also simply referred to as "divalent Eu ion concentration"). In this embodiment, the divalent Eu ion concentration of the phosphor is preferably 96% or more.

Figure 1:
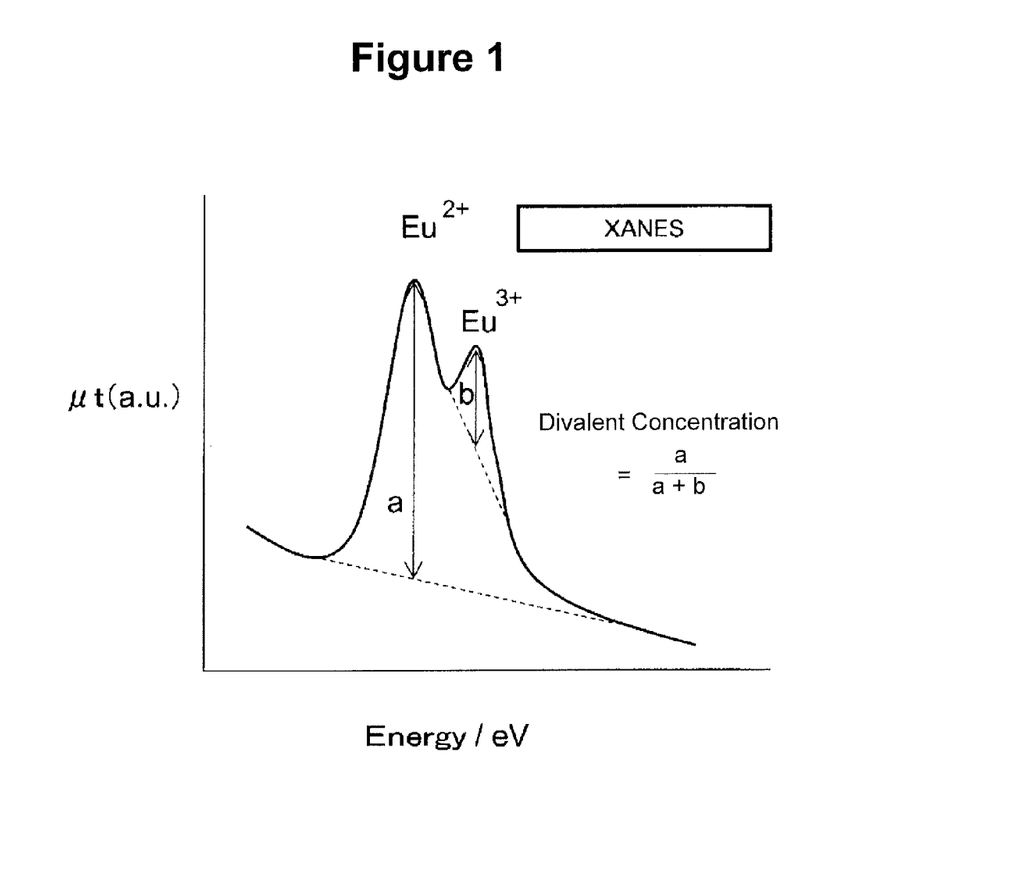
FIG. 1 illustrates an exemplary graph showing an L3 absorption edge XANES spectrum of a phosphor according to an embodiment of the invention.

The divalent Eu ion concentration and the trivalent Eu ion concentration may be measured from the XANES of the phosphor. For example, the content of $Eu^{2+}$ in the total Eu may be determined by measuring the XANES spectrum at the Eu-L3 absorption edge as shown in FIG. 1. XANES is a generic name for resonance absorption peaks appearing at the characteristic absorption edge of each element and in the vicinity thereof. XANES sensitively reflects the valence and structure of the element.

Generally, energy of a strong resonance absorption peak appearing in the L3 absorption edge XANES spectrum of a rare-earth element is known to depend on the valence of the rare-earth element. In the case of Eu, the Eu2+ peak has an energy about 8 eV lower than that of the Eu3+ peak, which means that it is possible to separate and quantify the two species. Assuming that the concentration of each of $Eu^{2+}$ and $Eu^{3+}$ is proportional to each peak height, (the $Eu^{2+}$ peak height)/{(the $Eu^{2+}$ peak height)+(the $Eu^{3+}$ peak height)} may be defined as the occupancy concentration of the $Eu^{2+}$ ion. That is, referring to FIG. 1, the peak heights of $Eu^{2+}$ and $Eu^{3+}$ are "a" and "b" respectively and thus, the concentration of $Eu^{2+}$ is defined as a/(a+b).

When a $Eu^{3+}$ source material such as europium oxide is used, the material may be typically heat-treated in a strong reducing atmosphere for a sufficient period of time, so that the relation $Eu^{2+}/(Eu^{2+}+Eu^{3+}) \geqq 0.9$ can be satisfied. The quantum efficiency of the phosphor can be increased by increasing the $Eu^{2+}$ content in this manner.

However, heat-treating in a strong reducing atmosphere can take a relatively long time. In general, therefore, a flux is used so that the heat treatment can be completed in a relatively short time. Examples of fluxes that are preferably used may comprise, without limitation, halides such as $SrCl_2$, $BaCl_2$, $NH_4Cl$, and $SrF_2$; and alkali compounds such as NaOH and KOH. In particular, $SrCl_2$ is preferred.

The flux can be easily removed by washing with water after the phosphor is synthesized. Using no flux is advantageous in that the step of washing with water can be eliminated. However, the quantum efficiency may tend to be lower in the case with no flux than in the case with a flux.

When the flux is removed, the composition of the phosphor is determined by the ratio between the Sr, Ba, Eu, and Si contents of the Sr, Ba, Eu and Si source materials added aside from the flux. Therefore, the composition of the phosphor, exclusive of the flux, does not substantially change before and after the heat treatment.

The phosphor may be represented by the formula $(M^1,Eu)_2SiO_4$, where $M^1$ represents at least one element selected, for example but without limitation, from Sr, Ba, Ca, and the like. The phosphor particles that constitute the phosphor emit light of yellow to green color and are excited by light at around 400 to 460 nm and emit fluorescence at 520 to 570 nm.

Such phosphor particles may have an average particle size of 0.1 to 50 µm, preferably 0.1 to 20 µm, more preferably 1 to 20 µm. In this range, a reduction in the luminous efficiency of the illumination device can be prevented without a significant reduction in the optical transparency of the wavelength converter.

Figure 2:
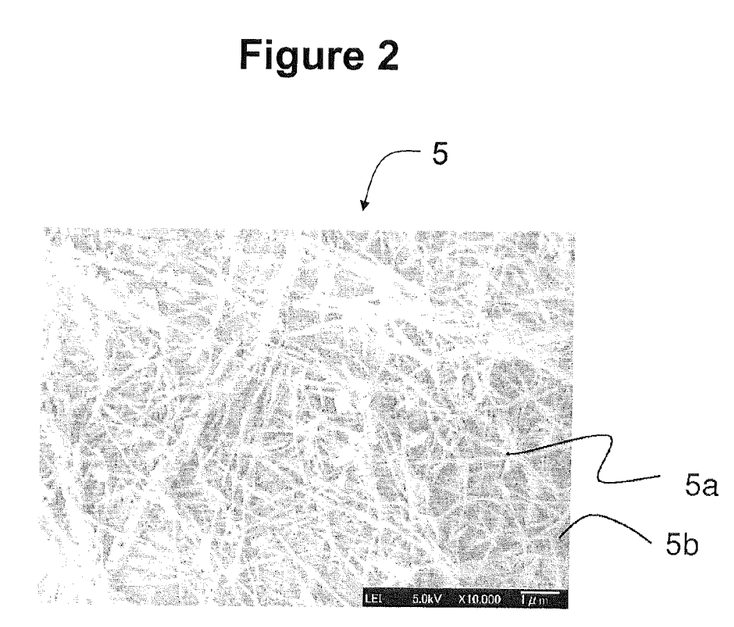
FIG. 2 illustrates an exemplary SEM photograph showing a phosphor particle comprising a phosphor core and fibrous bodies according to an embodiment of the invention.
Figure 3:
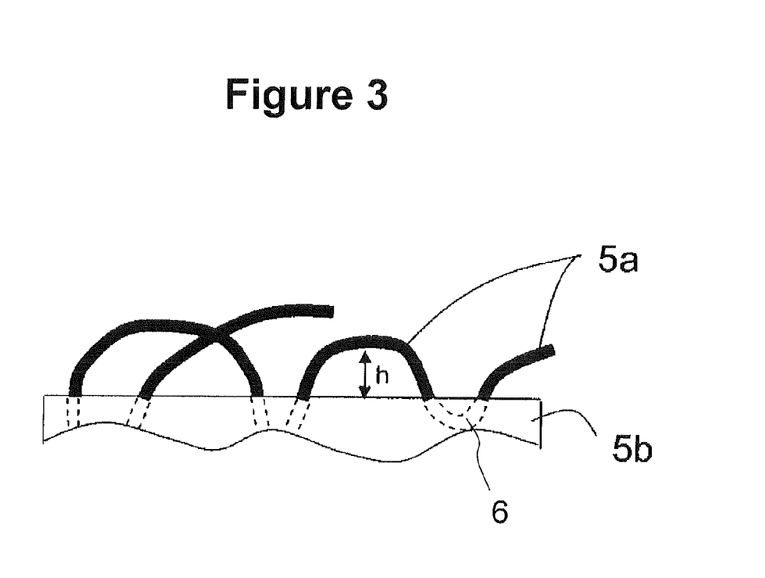
FIG. 3 is a schematic diagram illustrating exemplary fibrous bodies of FIG. 2 according to an embodiment of the invention.

As shown in FIGS. 2 and 3, a phosphor particle 5 comprises a phosphor core 5b and a large number of inorganic fibrous bodies 5a (fibrous bodies 5a) present on the surface of the phosphor core 5b, wherein at least one end of each of the fibrous bodies 5a is embedded in the phosphor core 5b and anchored to the surface of the phosphor core 5b. The fibrous bodies 5a can look like many layers of short needle-shaped fibrous bodies.

The fibrous body 5a may comprise an embedded end portion and a non-embedded portion (a portion other than the embedded portion) that is not embedded in the phosphor core 5b and may be separated by a specific space h (FIG. 3) from the surface of the phosphor core 5b. When the phosphor particles 5 are dispersed in a polymer resin 23 (FIG. 6), the space h can be filled with the resin 23.

If Ba with a relatively large atomic radius is used, the fluorescence peak wavelength can be shifted to the short wavelength side. When Ca with a relatively small atomic radius is used, it can be shifted to the long wavelength side. Therefore, the wavelength can be controlled by the content of Ba, Sr, or Ca.

A method of producing the phosphor according to an embodiment of the present invention is described below. Raw materials to form the phosphor are provided by weighing a powder of each of compounds containing Sr, Ba, Ca, Eu, and Si respectively, such as strontium carbonate, barium carbonate, calcium carbonate, europium oxide, and silica, in such a way that, for example, the molar ratio Eu/Si is from 0.01 to 0.1 and the molar ratio $(M^1+Eu)/Si$ is from 1.78 to 1.94.

Raw materials for the phosphor, may be selected from, oxides and materials that can be easily converted into oxides during a sintering process For example, the raw material may be, without limitation, carbonates, nitrates, sulfates, halides, hydroxides, and the like. A method for producing the phosphor containing Ba, Sr, Si, and Eu is described below.

The calcium source material may comprise, for example but without limitation, calcium oxide, calcium hydroxide, calcium carbonate, calcium chloride, calcium nitrate, calcium sulfate, calcium acetate, calcium oxalate, and calcium alkoxides.

The strontium source material may comprise, for example but without limitation, strontium oxide, strontium hydroxide, strontium carbonate, strontium chloride, strontium nitrate, strontium sulfate, strontium acetate, strontium oxalate, and strontium alkoxides.

The barium source material may comprise, for example but without limitation, barium oxide, barium carbonate, barium chloride, barium nitrate, barium sulfate, barium acetate, barium oxalate, and barium alkoxides.

The silicon source material may comprise, for example but without limitation, silicon dioxide such as quartz and cristobalite, and silicon alkoxides.

The europium source material may comprise, for example but without limitation, europium oxide, europium chloride and europium fluoride.

In order to promote the crystal growth and improve the luminous brightness, a low-melting-point compound such as an alkali metal halide, an alkaline earth metal halide, an ammonium halide, or a boron compound is added in an amount of 0.1% to 10% by mass as a flux to the phosphor raw material, and mixed therewith to form a raw material mixture.

More specifically, a Ba source material, a Sr source material, a Ca source material, a Eu source material, a Si source material, and a flux are subjected to a group (A) mixing method or a group (B) mixing method, shown below, so that a raw material mixture is prepared, which contains the phosphor raw materials and the flux.

The group (A) mixing method comprises a dry mixing method using a dry pulverizer such as a hammer mill, a roll mill, a ball mill, or a jet mill.

The group (B) mixing method comprises a wet mixing method that comprises adding water or the like to the materials, mixing the materials in the state of a slurry or solution with a pulverizer, and drying the mixture by spray drying, heating, natural drying, and the like.

In the mixing methods A and B, a liquid medium is preferably used particularly in order to uniformly mix or disperse small amounts of compounds in the entire body of materials. The wet mixing method is preferred, because it can form a uniform mixture with any other element compound.

The raw material mixture prepared as described above may be heat-treated to form the phosphor of the present invention.

When the raw material mixture is a powder, the raw material mixture is preferably mixed and pulverized into a powder with an average particle size of 1 μm or less. This allows the production of a sufficient amount of an apatite-type crystal powder by heat treatment of the flux-containing mixture in an oxidizing atmosphere. In addition, the use of such a fine powder can increase the rate of production of a Eu-containing apatite-type crystal powder and therefore allows the production of a mixed powder composed of: an apatite-type crystal powder substantially containing Eu, and a powder of a matrix material represented by the formula $M^1_2SiO_4$, where $M^1$ represents at least one of Sr, Ba and Ca. In order to prepare a raw material mixture powder with an average particle size of 1 μm or less by mixing and pulverizing, the mixing should be performed for a relatively long time, and the raw material mixture powder obtained by mixing and pulverizing should be allowed to pass through a mesh so that abnormal aggregate particles can be eliminated.

The raw material mixture powder is preferably heated at a temperature of 1000 to 1100° C. for 2 to 5 hours in an oxidizing atmosphere. The apatite-type crystal powder can be produced at 1000° C. or higher.

Eu is substantially incorporated into the apatite-type crystal by the heat treatment in the oxidizing atmosphere, so that the amount of Eu present in the form of $Eu_2O_3$ can be reduced, which makes it possible to produce a mixed powder composed of a Eu-containing apatite-type silicate powder and a matrix particle powder. In addition, Eu may be partially incorporated into the matrix particle.

Figure 4:
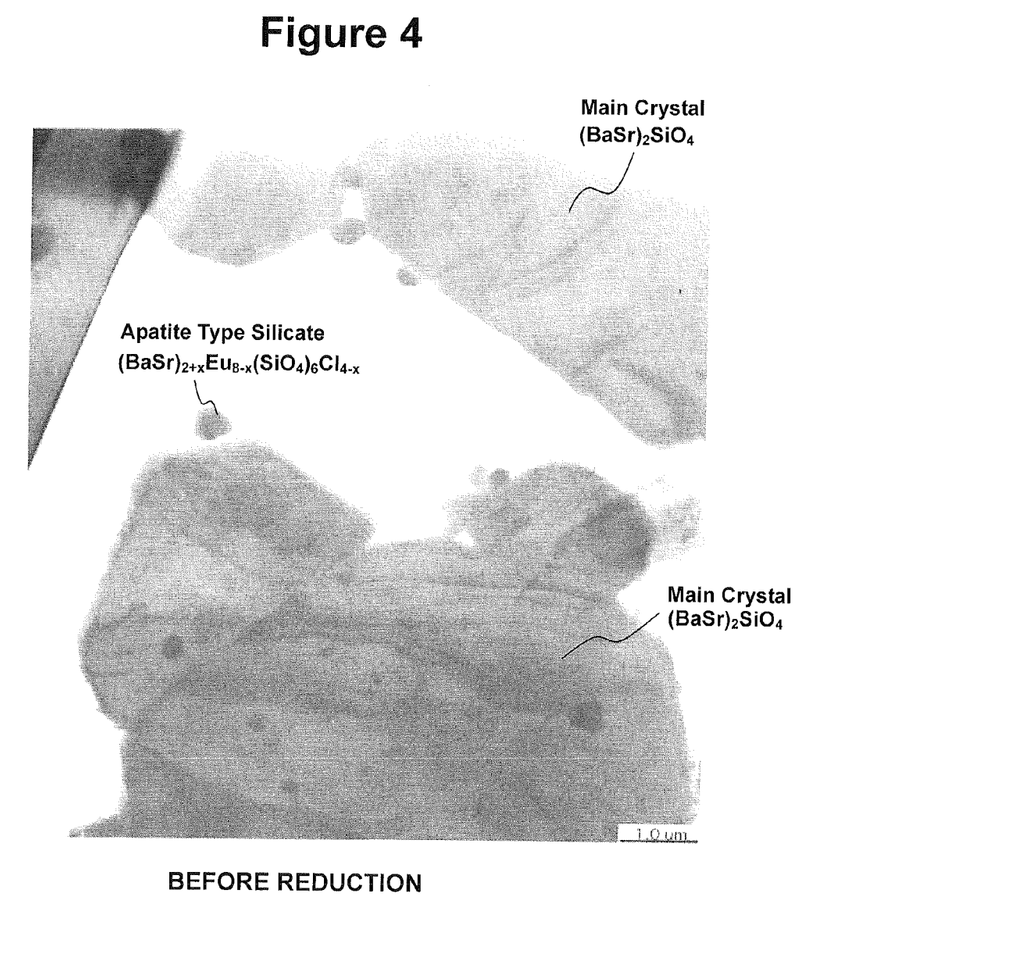
FIG. 4 illustrates an exemplary TEM photograph of a mixed powder before reduction according to an embodiment of the invention.
Figure 5:
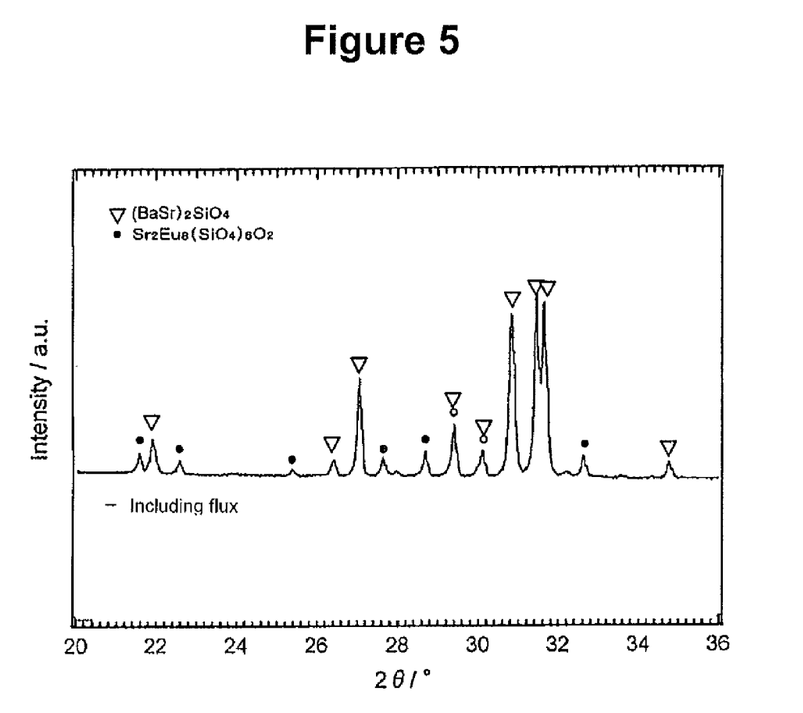
FIG. 5 shows the result of powder X-ray diffraction measurement after oxidation treatment according to an embodiment of the invention.

The apatite-type crystal may be an apatite-type silicate represented by $(BaSr)_{2+x}Eu_{8-x}(SiO_4)_6Cl_{4-x}$, in which Eu exists in a trivalent form. FIG. 4 illustrates a transmission electron-microscopic (TEM) photograph showing the product after the heat treatment in the oxidizing atmosphere. As shown in FIG. 4, the apatite-type crystal exists in and around the matrix particle. The particle size of the apatite-type crystal is much smaller than that of the matrix particle. FIG. 5 shows the result of powder X-Ray diffraction measurement. The result of powder X-ray diffraction measurement and the TEM photograph show that a mixed powder composed of a Eu-containing apatite-type silicate powder and a matrix particle powder can be prepared by the heat treatment in the oxidizing atmosphere. FIG. 5 shows a case where $Eu_2O_3$ is added in an amount larger than may be practical.

After the heat treatment in the oxidizing atmosphere, the resulting product may be allowed to pass through a mesh, and the resulting heat-treated powder with, for example, sizes of 75 μm or less may be heat-treated in a reducing atmosphere.

When the fine mixed powder free of abnormal aggregate particles and composed of a Eu-containing apatite-type crystal powder and a matrix particle powder is heat-treated in a reducing atmosphere, the trivalent Eu ion is easily reduced to the divalent Eu ion, so that Sr and/or Ba in the matrix particle and Eu in the apatite type crystal are mutually replaced, which increases the divalent Eu ion concentration of the phosphor to 96% or more. The apatite-type crystal is turned into a phosphor particle by the mutual replacement.

The heat treatment in the reducing atmosphere is preferably performed at a temperature of 1000 to 1300° C. for 3 to 12 hours.

The resulting product may then be washed with distilled water, so that a phosphor composed of a large number of phosphor particles can be obtained.

The ratio of the constituent elements of the phosphor of the present embodiment of the invention may be measured by ICP emission spectral analysis or any other appropriate method.

After the heat treatment in the oxidizing atmosphere, the heat treatment in the reducing atmosphere may be performed particularly at a low temperature of 1150° C. or less, and then washing may be performed. In this case, a large number of inorganic fibrous bodies 5a can be formed on the surface of the phosphor core 5b as shown in FIGS. 2 and 3.

If the temperature of the heat treatment in the reducing atmosphere is high, crystallization may proceed so that the production of the fibrous bodies 5a may be difficult even when washing is performed. A low temperature of 1000 to 1150° C. is particularly preferred.

After the heat treatment in the reducing atmosphere, for example, washing with distilled water may be performed, so that the inorganic fibrous bodies 5a can be formed on the surface of the phosphor core 5b. Washing with distilled water is preferably performed for a time period of 5 to 24 hours at a washing liquid temperature of 10 to 50° C.

The fibrous bodies are crystals formed by the heat treatment in the reducing atmosphere. When the heat treatment in the reducing atmosphere is performed at a relatively low temperature, the phosphor core 5b may not be entirely converted into crystals, so that amorphous materials containing $M^1$, Si and Eu can exist around the fibrous body crystals. The amorphous materials in the phosphor core 5b are dissolved by washing so that the fibrous bodies are exposed.

In order to partially expose the fibrous bodies, water is preferably used as the washing liquid. It is considered that the flux can be washed away by the water and that particularly the amorphous part of the phosphor core 5b can be hydrolyzed, so that the fibrous bodies can be exposed.

In the washing step, distilled water-soluble components are eluted from the surface of the phosphor core, so that the fibrous bodies 5a are exposed, and when the washing is performed for a prolonged period of time, the part of the fibrous bodies 5a not embedded in the phosphor core 5b (non-embedded part) can be shaped in such a way that it can be separated by a specific space h (FIG. 3) from the surface of the phosphor core 5b, while the end part of the fibrous bodies 5a is embedded in the phosphor core 5b (embedded part). The phosphor core 5b is made of $(M^1,Eu)_2SiO_4$, where $M^1$ represents at least one element selected from, without limitation, Sr, Ba and Ca, in which the leachable component is the amorphous part, while the fibrous bodies 5a are crystalline. Specifically, the fibrous bodies 5a are made of inorganic $(M^1,Eu)_2SiO_4$ crystals, where $M^1$ represents at least one element selected from, without limitation, Sr, Ba and Ca, preferably a combination of Sr and Ba.

The fibrous bodies 5a are exposed by washing. Therefore, some portions of the fibrous bodies on the core side are embedded in the phosphor core 5b, while some portions of the fibrous bodies are exposed, and when the washing is prolonged, the exposed portions of the fibrous bodies, other than both ends, are separated from the surface of the phosphor core 5b. However, at least one end of each of the fibrous bodies 5a is embedded. As shown in FIG. 3, a middle portion 6 of each of the fibrous bodies 5a can be embedded in the phosphor core 5b. Since such a structure looks like a plurality of fibrous bodies on the core surface, the term "a plurality of fibrous bodies" is also used to express such a structure in the description.

In the phosphor particle comprising the structure described above, a large number of inorganic fibrous bodies 5a are complicatedly anchored to the surface of the phosphor core 5b. Therefore, even when phosphor particles 5 are dispersed, for example, in an uncured polymer resin to form a transparent matrix of a wavelength converter, drag is generated on the inorganic fibrous bodies 5a so that a relatively large amount of energy is necessary for the movement of the phosphor particles 5. In this manner it is possible to suppress precipitation of the phosphor particles 5 in the uncured resin. Thus, even when the polymer resin is cured, uneven distribution of the phosphor particles 5 can be prevented.

In addition, the inorganic fibrous bodies 5a can have an anchoring effect on the cured resin, so that the adhesion between the polymer resin and the phosphor particles 5 can increase, which can suppress the separation between them. Therefore, a wavelength converter 19 produced with a dispersion of the phosphor particles 5 in a transparent polymer resin matrix and an illumination device 11 produced with the wavelength converter 19 are less likely to cause whitening even after long-term use and have a long life.

The inorganic fibrous bodies 5a are preferably formed so as to be located 50 nm or more, particularly 100 nm or more above the surface of the phosphor core 5b. As described above, the sintering in the reducing atmosphere may be insufficiently performed, or the time for which the step of washing with distilled water is performed may be controlled, so that the size and amount of the inorganic fibrous bodies 5a can be appropriately controlled. Specifically, somewhat strong sintering in the reducing atmosphere can increase the amount and size of the fibrous bodies 5a, and the fibrous bodies 5a can be located at a higher position by increasing the washing time period. It is understood that the height of the fibrous bodies 5a can be measured by analysis with a reflection electron microscope.

Figure 6:
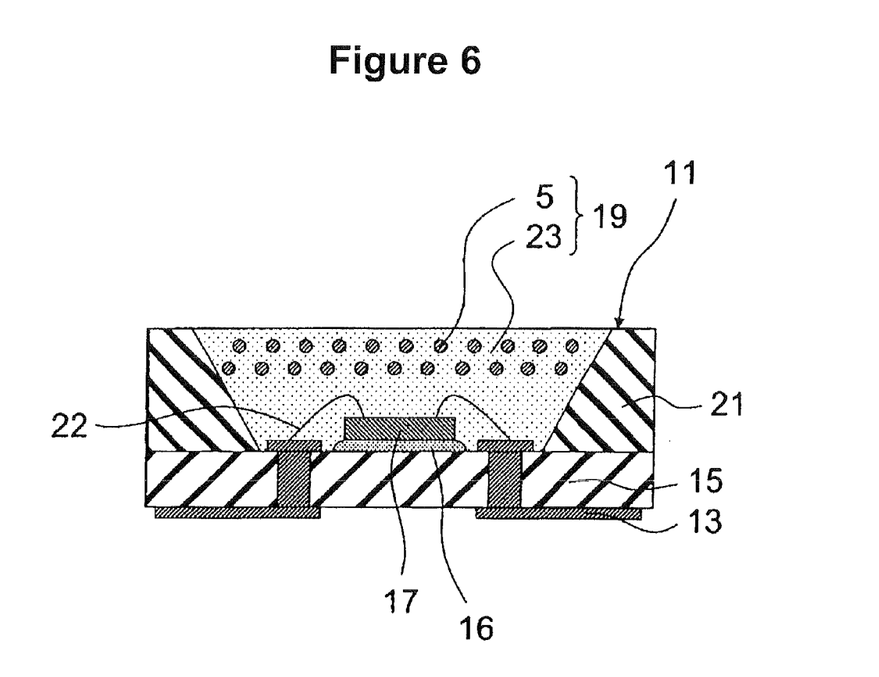
FIG. 6 illustrates a cross-sectional view illustrating a wavelength converter and illumination device according to an embodiment of the invention.

FIG. 6 is a schematic cross-sectional view showing an example of the illumination device 11 according to an embodiment of the present invention. The illumination device 11 may comprise a substrate 15 (base member 15) comprising electrodes 13, a light-emitting element 17 coupled to the base member 15 via, for example, an adhesive 16, a monolayer wavelength converter 19 (wavelength converter 19) formed on the substrate 15 to cover the light-emitting element 17, and a reflective component 21 for reflecting light. Wires 22 are configured to couple the electrodes 13 to the light-emitting element 17.

The wavelength converter 19 comprises an optically transmissive matrix containing a phosphor (not shown) to emit fluorescence at a wavelength of 430 nm to 490 nm (blue-emitting phosphor), a phosphor (not shown) to emit fluorescence at a wavelength of 520 nm to 570 nm (green-emitting phosphor), and a phosphor (not shown) to emit fluorescence at a wavelength of 600 nm to 650 nm (red-emitting phosphor). A part of the wavelengths of incident light, which is emitted from the light-emitting element 17 serving as a light source, is converted to another wavelength by the wavelength converter 19. Light containing the wavelength component resulting from the conversion is output by the wavelength converter 19, so that the light from the light-emitting element 17 containing a certain wavelength component is converted to light containing a different wavelength component.

The blue-emitting phosphor typically comprises a material capable of being excited by light with a wavelength of about 400 nm at high quantum efficiency. The blue-emitting phosphor may be any material capable of being excited by light with a wavelength of about 400 nm to emit fluorescence with a wavelength of 430 nm to 490 nm. Examples of the blue-emitting phosphor that may comprise, for example but without limitation, $(Sr,Ca,Ba,Mg)_{10}(PO_4)_6Cl_2:Eu$, $BaMgAl_{10}O_{17}:Eu,Mn$, $BaMgAl_{10}O_{17}:Eu$, $(Ba,Eu)MgAl_{10}O_{17}$, $(Sr,Ca,Ba,Mg)_{10}(PO_4)_6Cl_{17}:Eu$, $Sr_{10}(PO_4)_6Cl_{12}:Eu$, $(Ba,Sr,Eu)(Mg,Mn)Al_{10}O_{17}$, $10(Sr,Ca,Ba,Eu)\cdot 6PO_4\cdot Cl_2$, and $BaMg_2Al_{16}O_{25}:Eu$. [$(M,Mg)_{10}(PO_4)_6Cl_2:Eu$] is preferably used as the blue phosphor, where M represents at least one selected from Ca, Sr and Ba, or [$BaMgAl_{10}O_{17}:Eu$].

The green-emitting phosphor may comprise a material capable of being excited by light with a wavelength of 400 nm to 460 nm.

The red-emitting phosphor comprises a material capable of being excited not only by light with a wavelength of 400 nm to 460 nm but also by light with a wavelength of about 550 nm. The red light-emitting phosphor may be any material capable of being excited by light with a wavelength of 350 to 450 nm and by light with a wavelength of about 550 nm to emit fluorescence with a wavelength of 600 nm to 650 nm. Examples of red-emitting phosphors that are preferably used may comprise $A_xB_y(O,S)_z:M$, where A represents at least one of Sr, Ca, Mg, Ba, and Zn, B represents at least one of Al, Ga, In, and Y, and M represents at least one of lanthanoids; SrS:Eu; or $M_3MgSi_2O_8:Eu$, where M represents at least one of Sr, Ca and Ba.

In one embodiment, the wavelength converter 19 and the illumination device 11 can be prepared using the green-emitting phosphor in the wavelength converter 19.

When the wavelength converter 19 is formed, the phosphors are preferably dispersed in a transparent matrix such as a polymer resin or a glass material, so that the phosphors can be uniformly dispersed and supported and prevented from photo-degradation. The polymer resin film or the glass material such as a sol-gel glass thin film preferably has high transparency and durability such that discoloration would not easily occur due to heat or light.

Examples of materials that may be used to form the polymer resin film comprise, but are not limited to, for example, epoxy resins, silicone resins, polyethylene terephthalate, polybutylene terephthalate, polyethylene naphthalate, polystyrene, polycarbonate, polyether sulfone, cellulose acetate, polyarylate, and derivatives thereof. In particular, the polymer resin film preferably has high transparency in the wavelength range of 350 nm or more. Silicone resins are more preferably used in view of heat resistance in addition to such transparency.

Examples of glass materials comprise, for example but without limitation, silica, titania, zirconia, and composite materials thereof. The phosphors may be each independently dispersed in a glass material, when the device is formed. The glass material can prolong the life of the product, because it is highly resistant to light, particularly ultraviolet light, and to heat, as compared with the polymer resin film. The glass material can also form a reliable illumination device, because it can improve the stability.

The wavelength converter 19 may be formed by a coating method using a glass material such as a sol-gel glass film or a polymer resin film. The coating method is preferably dispenser coating, while it may be any general coating method. For example, the wavelength converter 19 may be produced by mixing the phosphor into a fluid uncured polymer resin or glass material or a polymer resin or glass material that is made plastic with a solvent. For example, a silicone resin may be used as the uncured resin. The polymer resin may comprise a two-component curing type or one-component curing type. When the polymer resin comprises a two-component curing type, the phosphor may be mixed into both or one of the components. The polymer resin may comprise an acrylic resin capable of being made plastic with a solvent.

The uncured material may be formed into a film by dispenser coating or the like or poured into a specific mold, and then fixed so that a cured wavelength converter 19 can be obtained. The method for curing the polymer resin or glass material may be a curing method using thermal energy or light energy or a method of evaporating the solvent.

A conductor that forms the electrodes 13 functions as an electrically conducting path to electrically connect the light-emitting element 17. The conductor is drawn from the lower face of the substrate 15 to the upper face and electrically connected to the light-emitting element 17 through the wires 22. For example, a metalized layer containing particles of a metal, such as but without limitation, W, Mo, Cu, or Ag may be used as the conductor. When the substrate 15 is ceramic, the wiring conductor may be formed on the upper face of substrate 15 by heat-treating, at high temperature, a metal paste comprising, for example but without limitation, tungsten (W), molybdenum (Mo)-manganese (Mn), or the like. When the substrate 15 is made of resin, a lead terminal made of, for example but without limitation, copper (Cu), an iron (Fe)-nickel (Ni) alloy, or the like may be placed and fixed into the substrate 15 by molding.

The substrate 15 has a high thermal conductivity and high total reflectivity. For example, a ceramic material such as, without limitation, aluminum nitride, or preferably a dispersion of metal oxide fine particles in a polymer resin is used for the substrate 15.

The light-emitting element 17 may comprise a semiconductor material capable of emitting light at a center wavelength of 370 to 420 nm so that the phosphor can be efficiently excited by light from the light-emitting element 17. Thus, an illumination device using the light-emitting element 17 can provide high light power intensity and higher luminous efficiency.

The light-emitting element 17, which preferably emits light at the center wavelength referred to above, preferably comprises a structure (not shown) including a light-emitting layer formed of a semiconductor material on a surface of the substrate 15 of the light-emitting element 11. In this manner, the light-emitting element 11 has high external quantum efficiency. The semiconductor material comprises various semiconductors such as, without limitation, ZnSe and nitride semiconductors such as GaN. The semiconductor material may be of any type, as long as it has an emission wavelength in the center wavelength range referred to above. The semiconductor material may be deposited by a crystal growth method such as, without limitation, a metal-organic chemical vapor-phase deposition (MOCVD) method, or a molecular beam epitaxy method so that a laminated structure comprising a light-emitting layer made of the semiconductor material can be formed on the substrate 15 on the light-emitting element 17. For example but without limitation, when a nitride semiconductor light-emitting layer is formed on the surface, sapphire, spinel, SiC, Si, ZnO, $ZrB_2$, GaN, quartz, or the like is preferably used for the substrate 15 on the light-emitting element 17, in order to form the nitride semiconductor with high crystallinity and high mass-productivity.

If necessary, a reflective component 21 for reflecting light may be formed on the side of the light-emitting element 17 and the wavelength converter 19 so that light escaping toward the side can be reflected to the front to increase the light power intensity. Examples of materials that may be used to form the reflective component 21 comprise, for example but without limitation, aluminum (Al), nickel (Ni), silver (Ag), chromium (Cr), titanium (Ti), copper (Cu), gold (Au), iron (Fe), laminated structures thereof or alloys thereof, ceramics such as alumina ceramics, resins such as epoxy resins, and the like.

The illumination device 11 may be obtained by placing the wavelength converter 19 on the light-emitting element 17 as shown in FIG. 6. The method for placing the wavelength converter 19 on the light-emitting element 17 may comprise a step of providing the wavelength converter 19 in a form of a cured sheet and placing the wavelength converter 19 on the light-emitting element 17. Alternatively, the method for placing the wavelength converter 19 on the light-emitting element 17 may comprise steps of depositing a liquid uncured material on the light-emitting element 17 and curing the material.

For example, the luminaire of this embodiment is formed by placing a plurality of illumination devices such as the illumination device 11 on a substrate and electrically connecting the illumination devices to one another. Alternatively, a plurality of light-emitting elements 17, wavelength converters 19 and reflective components 21 may be formed on the surface of the substrate 15 to form a plurality of illumination devices, which may be electrically connected to one another to form the luminaire.

The phosphor, wavelength converter 19, and illumination device 11 are more specifically described by the non-limiting examples and the comparative examples below.

Example 1

Powders of strontium carbonate, barium carbonate, calcium carbonate, silica, and europium oxide were mixed so that the molar ratio of each of Sr, Ba, Eu, and Ca to Si is shown in Table 1. Based on 100 parts by mass of the resulting mixture, 2 parts by mass of $SrCl_2$ as a flux was added to the mixture, so that a raw material powder was prepared.

The raw material powder, 2-propyl alcohol and media balls of zirconia were added to a plastic pot and mixed by stirring for 48 hours.

The resulting mixture solution was discharged, while the media balls were removed using a 190 μm mesh nylon strainer. The mixture was then heated at 110° C. for 8 hours, so that 2-propyl alcohol was removed.

The raw material mixture powder resulting from the removal of 2-propyl alcohol was then placed in an alumina crucible and heated under the atmosphere at 1100° C. for 3 hours. The powder was then heated at 1200° C. for a time period of 4.5 to 9 hours in a nitrogen gas stream containing 12% of hydrogen, so that a phosphor containing a crystal represented by $(M^1,Eu)_2SiO_4$ as a main crystal was synthesized.

The main crystal was identified by powder X-ray diffraction measurement as described below. A powder X-ray diffractometer (MAC M18XCE manufactured by Mac Science) with a (Cu—Kα) X-ray source was used, which was optically adjusted so that the diffraction angle error Δ2θ was reduced to 0.05° or less in the scanning range. The powder X-ray diffraction measurement was performed under conditions such that angle reproducibility could be ensured with a diffraction angle error Δ2θ of 0.05° or less, which was associated with the eccentricity of the sample when the standard silicon 111 peak was used.

In a comparative example, no flux was added when a phosphor was prepared. These phosphors were washed with water.

After the washing the phosphor with water, each resulting phosphor was subjected to XANES analysis, and the divalent Eu ion concentration $\{Eu^{2+}/(Eu^{2+}+Eu^{3+})\}\times 100$ was determined from the $Eu^{2+}$ peak at about 6977 eV and the $Eu^{3+}$ peak at about 6985 eV.

After the washing the phosphor with water, each resulting phosphor was also subjected to ICP emission spectral analysis, so that the composition ratio of the phosphor was determined. The total molar ratio (Sr+Ba+Eu)/Si was determined from the result. As a result, the total molar ratio was the same as the blending ratio. Therefore, the composition of the phosphor is omitted from the description.

The quantum efficiency of the resulting phosphor was measured using a spectrofluoro-photometer FP-6500 manufactured by JASCO Corporation. The phosphor was charged into a dedicated cell and irradiated with 395 nm exciting light when the fluorescence spectrum was measured. The quantum efficiency was calculated from the result using the quantum efficiency measurement software comprised with the spectrofluoro-photometer.

TABLE 1

| Sample No. | Composition of mixture | | | | | Heating time in nitrogen gas stream containing hydrogen (hours) | ICP analysis result (Sr + Ba + Ca + Eu)/Si | XANES analysis result Divalent Eu ion concentration (%) | Phosphor properties Quantum efficiency (%) |
|---|---|---|---|---|---|---|---|---|---|
| | Eu/Si (Molar ratio) | Sr/Si (Molar ratio) | Ba/Si (Molar ratio) | Ca/Si (Molar ratio) | Flux ($SrCl_2$) content (mass %) | | | | |
| 1-1 | 0.05 | 1.26 | 0.417 | 0 | 2 | 9 | 1.73 | 95 | 38 |
| 1-2 | 0.05 | 1.30 | 0.429 | 0 | 2 | 9 | 1.78 | 95 | 42 |
| 1-3 | 0.05 | 1.34 | 0.442 | 0 | 2 | 9 | 1.83 | 95 | 43 |
| 1-4 | 0.05 | 1.38 | 0.457 | 0 | 2 | 9 | 1.89 | 95 | 44 |
| 1-5 | 0.05 | 1.40 | 0.462 | 0 | 2 | 9 | 1.91 | 95 | 44 |
| 1-6 | 0.05 | 1.40 | 0.462 | 0 | 2 | 4.5 | 1.91 | 90 | 41 |
| 1-7 | 0.05 | 1.42 | 0.469 | 0 | 2 | 9 | 1.94 | 95 | 41 |
| 1-8 | 0.05 | 1.44 | 0.476 | 0 | 2 | 9 | 1.97 | 95 | 38 |
| * 1-9 | 0.05 | 1.40 | 0.462 | 0 | 0 | 9 | 1.91 | 50 | 10 |
| * 1-10 | 0.05 | 1.44 | 0.476 | 0 | 0 | 9 | 1.97 | 50 | 15 |
| 1-11 | 0.03 | 1.30 | 0.429 | 0 | 2 | 9 | 1.76 | 95 | 40 |
| 1-12 | 0.03 | 1.44 | 0.476 | 0 | 2 | 9 | 1.95 | 95 | 42 |
| 1-13 | 0.07 | 1.26 | 0.417 | 0 | 2 | 9 | 1.75 | 95 | 41 |
| 1-14 | 0.07 | 1.42 | 0.469 | 0 | 2 | 9 | 1.96 | 95 | 42 |
| 1-15 | 0.05 | 0.96 | 0.417 | 0.3 | 2 | 9 | 1.73 | 95 | 40 |
| 1-16 | 0.05 | 1.12 | 0.469 | 0.3 | 2 | 9 | 1.94 | 95 | 42 |
| * 1-17 | 0.05 | 1.47 | 0.482 | 0 | 2 | 9 | 2.00 | 95 | 34 |
| 1-18 | 0.05 | 1.59 | 0.253 | 0 | 2 | 9 | 1.89 | 95 | 42 |
| 1-19 | 0.05 | 1.19 | 0.650 | 0 | 2 | 9 | 1.89 | 95 | 44 |

The mark * indicates that the sample is outside the scope of the present invention.

As shown in Table 1, the phosphors of Sample Nos. 1-9 and 1-10, which are samples outside the scope of the present invention, had relatively low quantum efficiencies, and the phosphor of Sample No. 1-17, which has a total molar ratio (Sr+Ba+Eu)/Si of 2 and is a sample outside the scope of the invention, had a quantum efficiency as low as 34%, although it had a divalent Eu ion concentration of 95%. In contrast, the phosphors of Sample Nos. 1-1 to 1-8, 1-11 to 1-16, 1-18, and 1-19, which exhibit relatively high quantum efficiencies according to an embodiment of invention.

Example 2

$SrCO_3$, $BaCO_3$, $SiO_2$, and $Eu_2O_3$ powders were used as raw materials, and a $SrCl_2$ powder was used as a flux. $SrCO_3$, $BaCO_3$, $SiO_2$, $Eu_2O_3$, and $SrCl_2$ were mixed in amounts of 52.3% by mass, 25.5% by mass, 15.0% by mass, 2.2% by mass, and 5% by mass, respectively, to form 100 g of a mixture. The molar ratios Sr/Si, Ba/Si and Eu/Si were 1.419, 0.518 and 0.025, respectively, and the total molar ratio (Sr+Ba+Eu)/Si was 1.96.

The powders were mixed with 200 g of isopropyl alcohol as a solvent and subjected to ball mill mixing for the time period shown in Table 2.

The isopropyl alcohol used as a solvent was evaporated at 80° C., and the resulting dry mixed powder was allowed to pass through a #200 mesh (75 μm mesh), so that a raw material mixture powder was obtained with the average particle size $D_{50}$ shown in Table 2. The raw material mixture powder was then placed in a crucible and heated in the atmosphere at 1000° C. for 3 hours.

After the oxidation, the powders of Sample Nos. 2-1 to 2-4 according to the present invention were each identified as being composed of an apatite-type silicate powder and a matrix particle powder by powder X-ray diffraction measurement using TEM and Cu—Kα ray.

Thereafter, the mixed powders were each allowed to pass through a #200 mesh and then heat-treated at 1200° C. for 9 hours in a reducing atmosphere with a hydrogen concentration of 12% (the other component was nitrogen). Sample No. 2-6 was not subjected to the reduction treatment.

The resulting powder was washed by stirring with distilled water in an amount 10 times the weight of the powder for 10 hours, and then the water was removed using a drier.

The product was powdered using a mesh or the like under the application of a pressure, so that a phosphor was prepared. The divalent ion concentration of the resulting phosphor was determined from its L3 absorption edge XANES spectrum. The result is shown in Table 2. The main crystal in the phosphor was identified by the same method as in Example 1. As a result, the main crystal was a crystal represented by $(M^1, Eu)_2SiO_4$.

The phosphor powder was added in an amount of 20% by mass to an uncured silicone resin. The silicone resin was then cured at a temperature of 150° C., so that a 0.8 mm-thick wavelength converter was prepared.

The quantum efficiency of the resulting phosphor was measured using a spectrofluoro-photometer FP-6500 manufactured by JASCO Corporation. The phosphor was charged into a dedicated cell and irradiated with 395 nm exciting light when the fluorescence spectrum was measured. The quantum efficiency was calculated from the result using the quantum efficiency measurement software comprised with the spectrofluoro-photometer.

TABLE 2

| Sample No. | Flux | Wet mixing time (hours) | After mixing and pulverizing Average particle size $D_{50}$ (μm) | Divalent Eu ion concentration (%) | Quantum efficiency (%) |
|---|---|---|---|---|---|
| 2-1 | SrCl$_2$ | 24 | 1.2 | 96 | 40 |
| 2-2 | SrCl$_2$ | 48 | 1 | 98 | 41 |
| 2-3 | SrCl$_2$ | 72 | 0.8 | 100 | 42 |
| 2-4 | SrCl$_2$ | 96 | 0.7 | 100 | 42 |
| * 2-5 | Absent | 48 | 1 | 81 | 34 |
| * 2-6 | SrCl$_2$ | 48 | 1 | 0 | 0 |

The mark * indicates that the sample is outside the scope of the present invention.

As shown in Table 2, Sample No. 2-5, which is outside the scope of the invention, showed reduced apatite production and had a divalent Eu ion concentration of 81%, because no flux was added in the preparation of the sample. Although the flux was added, Sample No. 2-6, which is also outside the scope of the invention, had a divalent Eu ion concentration of 0%, because the reduction treatment was not performed.

Figure 7:
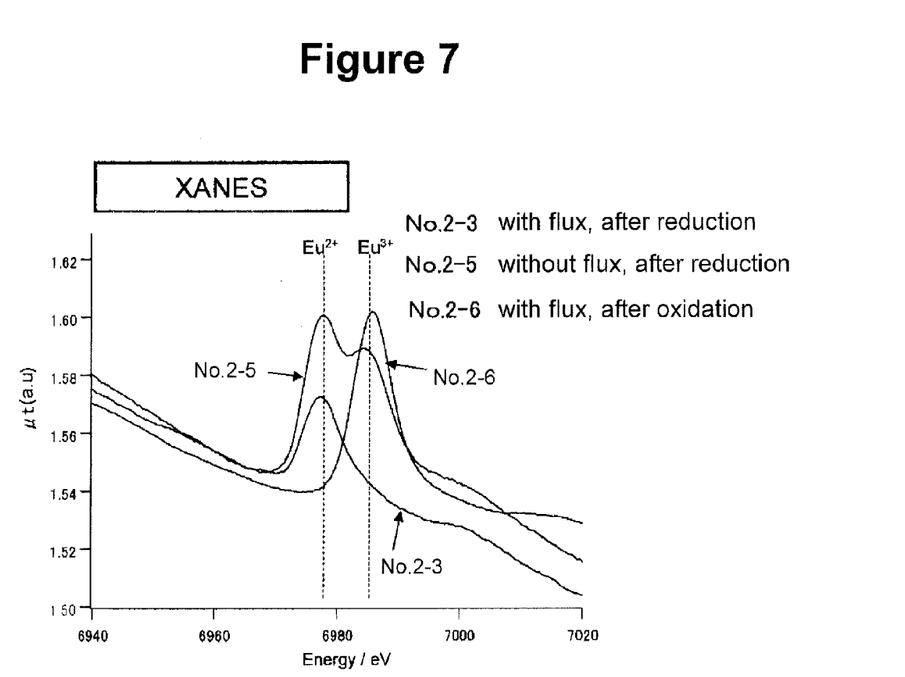
FIG. 7 illustrates a graph illustrating the result of XANES measurement of phosphors according to an embodiment of the invention.

In contrast, Sample Nos. 2-1 to 2-4 according to the present invention each had a divalent Eu ion concentration of 96% or more after the reduction treatment, because the preparation of each sample comprised adding a flux, performing wet mixing to form a fine mixed powder, and allowing the mixed powder to pass through a mesh after the oxidation treatment. The L3 absorption edge XANES spectrum of each of Sample Nos. 2-3, 2-5 and 2-6 is shown in FIG. 7.

Example 3

SrCO$_3$, BaCO$_3$, SiO$_2$, and Eu$_2$O$_3$ powders were used as raw materials, and a SrCl$_2$ powder was used as a flux. SrCO$_3$, BaCO$_3$, SiO$_2$, Eu$_2$O$_3$, and SrCl$_2$ were mixed in amounts of 52.3% by mass, 25.5% by mass, 15.0% by mass, 2.2% by mass, and 5% by mass, respectively, to form 100 g of a mixture. The molar ratios Sr/Si, Ba/Si and Eu/Si were 1.419, 0.518 and 0.025, respectively, and the total molar ratio (Sr+Ba+Eu)/Si was 1.96.

The powders were mixed with about 200 g of isopropyl alcohol as a solvent and subjected to ball mill mixing for about 48 hours.

The isopropyl alcohol used as a solvent was evaporated at about 80° C., so that a dry raw material mixture powder was obtained. The raw material mixture powder was then placed in a crucible and heated in the atmosphere at about 1100° C. for about 3 hours.

The powder was then heat-treated at the temperature shown in Table 3 in a reducing atmosphere with a hydrogen concentration of about 12% (the other component was nitrogen).

The resulting powder was washed by stirring with distilled water in an amount 10 times the weight of the powder for the time period shown in Table 3 (at room temperature). The supernatant of the washing liquid was removed, and the water was removed using a drier.

The product was powdered using a mesh or the like under the application of a pressure, so that a phosphor was prepared. The main crystal in the phosphor was identified by the same method as in Example 1. As a result, the main crystal was a crystal represented by $(M^1,Eu)_2SiO_4$. The divalent Eu ion concentration was also determined by the same method as in Example 1. As a result, the divalent Eu ion concentration of Sample No. 3-1 was about 20%, while that of each of the other samples according to the present invention was about 90% or more. The phosphor was added in an amount of about 20% by mass to an uncured silicone resin. The silicone resin was then cured at a temperature of about 150° C., so that a 0.8 mm-thick wavelength converter was prepared.

In the preparation of the wavelength converter, the curing was performed after the phosphor particles were mixed into the silicone resin and then allowed to stand for about 30 minutes. A reflection electron microscope (SEM) was used to investigate how the presence or absence of fibrous bodies influenced precipitation of the phosphor particles and uneven distribution of the phosphor particles in the prepared wavelength converter. The wavelength converter was cut, and whether the phosphor was unevenly distributed was determined by observing the cut surface with a SEM.

Whether fibrous bodies were present or absent was determined by observing the surface of the resulting phosphor particles with a SEM. The wavelength converter was also subjected to a temperature cycling reliability test (a cycle of about −40 to about 125° C.), and then the presence or absence of whitening was determined. The results are shown in Table 3.

TABLE 3

| Sample No. | Reduction temperature (° C.) | Washing time (hours) | Presence or absence of fiorous bodies | Height of fiorous bodies (nm) | presence or absence of uneven distribution of phosphor particles | Temperature cycing reliability test (−40 to 125° C. in gas phase) (cycles) | | |
|---|---|---|---|---|---|---|---|---|
| | | | | | | 200 | 500 | 800 |
| * 3-1 | 1300 | 3 | Absent | — | Present | Whitening | — | — |
| 3-2 | 1000 | 10 | Present | 70 | Absent | Nothing abnormal | Nothing abnormal | Nothing abnormal |
| 3-3 | 1100 | 10 | Present | 70 | Absent | Nothing abnormal | Nothing abnormal | Nothing abnormal |
| 3-4 | 1100 | 13 | Present | 100 | Absent | Nothing abnormal | Nothing abnormal | Nothing abnormal |
| 3-5 | 1100 | 24 | Present | 200 | Absent | Nothing abnormal | Nothing abnormal | Nothing abnormal |
| 3-6 | 1150 | 10 | Present | 80 | Absent | Nothing abnormal | Nothing abnormal | Nothing abnormal |

The mark * indicates that the sample is outside the scope of the present disclosure invention.

As shown in Table 3, Sample No. 3-1 with no fibrous body, which is outside the scope of the invention, showed whitening of the wavelength converter after 200 temperature cycles. Sample No. 3-1 produced no fibrous body, because the reduction temperature was as high as 1300° C. so that a highly crystalline phosphor was produced while amorphous material production was suppressed.

In contrast, Sample Nos. 3-2 to 3-6 according to the present invention each had fibrous bodies on the surface of the phosphor core and did not show whitening of the wavelength converter even after 800 temperature cycles.

The invention claimed is:

1. A phosphor comprising
   $M^1$, Eu and Si, where $M^1$ represents at least one of Sr, Ba and Ca, and comprising a crystal represented by $(M^1, Eu)_2SiO_4$ as a main crystal, wherein
   a divalent Eu ion concentration of the phosphor is 90% or more, with respect to a total amount of divalent and trivalent Eu ions, and
   a $(M^1+Eu)/Si$ molar ratio of the phosphor is less than 2, wherein the $(M^1+Eu)/Si$ molar ratio is a sum of a molar ratio of $M^1$ to Si and a molar ratio of Eu to Si,
and further comprising a plurality of phosphor particles, wherein
   each of the phosphor particles comprises a phosphor core and a plurality of fibrous bodies present on a surface of the phosphor core, and
   at least one end of each of the fibrous bodies is embedded in the phosphor core.

2. The phosphor according to claim 1, wherein the $(M^1+Eu)/Si$ molar ratio is 1.78 or more.

3. The phosphor according to claim 1, wherein the divalent Eu ion concentration of the phosphor is 96% or more with respect to the total amount of divalent and trivalent Eu ions.

4. The phosphor according to claim 1, wherein
   each of the fibrous bodies comprises an embedded part embedded in the phosphor core and a non-embedded part not embedded in the phosphor core, and
   the non-embedded part is separated from the surface of the phosphor core.

5. A method for producing a phosphor, comprising:
   heat-treating a raw material mixture in an oxidizing atmosphere to obtain a mixed powder comprising an Eu-containing apatite-type crystal powder and a powder of a matrix material represented by a formula $M^1_2SiO_4$, wherein the raw material mixture comprises a mixture of a flux and phosphor raw materials that comprise
   an $M^1$ source material, where $M^1$ represents at least one of Sr, Ba and Ca,
   a Eu source material, and
   a Si source material,
   and has a $(M^1+Eu)/Si$ molar ratio of less than 2, wherein the $(M^1+Eu)/Si$ molar ratio is a sum of the molar ratio of $M^1$ to Si and the molar ratio of Eu to Si;
   heat-treating the mixed powder in a reducing atmosphere to produce phosphor particles; and washing a surface of the phosphor particles to form a phosphor core and fibrous bodies such that at least one end of each of the fibrous bodies is embedded in the phosphor core and other parts of each of the fibrous bodies is exposed.

6. The method according to claim 5, wherein the heat-treating of the mixed powder in the reducing atmosphere is performed at a temperature of 1150° C. or less.

7. A wavelength converter operable to change a wavelength of light emitted from a light emitting element, the wavelength converter comprising:
   an optically transmissive matrix operable to receive a first light and emit a second light, wherein a first wavelength of the first light is different from a second wavelength of the second light; and
   a phosphor dispersed in the optically transmissive matrix, wherein the phosphor comprises:
      $M^1$, Eu and Si, where $M^1$ represents at least one of Sr, Ba and Ca, and comprising a crystal represented by $(M^1, Eu)_2SiO_4$ as a main crystal, wherein
      a divalent Eu ion concentration of the phosphor is 90% or more with respect to a total amount of divalent and trivalent Eu ions, and
   a $(M^1+Eu)/Si$ molar ratio of the phosphor is less than 2, wherein the $(M^1+Eu)/Si$ molar ratio is a sum of a molar ratio of $M^1$ to Si and a molar ratio of Eu to Si, and
   further comprising a plurality of phosphor particles, wherein
      each of the phosphor particles comprises a phosphor core and a plurality of fibrous bodies present on a surface of the phosphor core, and
      at least one end of each of the fibrous bodies is embedded in the phosphor core.

8. An illumination device, comprising:
   a base member;
   a light-emitting element coupled to the base member; and
   a wavelength converter according to claim 7 operable to change a wavelength of light emitted from the light-emitting element.

9. The wavelength converter according to claim 7, wherein the fibrous body comprises an embedded part embedded in the phosphor core and a non-embedded part not embedded in the phosphor core, and
the non-embedded part is separated from the surface of the phosphor core.

10. The wavelength converter according to claim 7, wherein the $(M^1+Eu)/Si$ molar ratio is 1.78 or more.

11. The wavelength converter according to claim 7, wherein the divalent Eu ion concentration of the phosphor is 96% or more with respect to the total amount of divalent and trivalent Eu ions.

* * * * *